(12) United States Patent
Xu et al.

(10) Patent No.: US 8,487,398 B2
(45) Date of Patent: Jul. 16, 2013

(54) CAPACITOR DEVICE USING AN ISOLATED WELL AND METHOD THEREFOR

(75) Inventors: Hongzhong Xu, Chandler, AZ (US); Zhihong Zhang, Phoenix, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 237 days.

(21) Appl. No.: 12/835,900

(22) Filed: Jul. 14, 2010

(65) Prior Publication Data

US 2012/0012970 A1    Jan. 19, 2012

(51) Int. Cl.
*H01L 21/70* (2006.01)
(52) U.S. Cl.
USPC ....... 257/506; 257/532; 257/E29.02; 438/393
(58) Field of Classification Search
USPC ............. 257/506, 532, E29.02; 438/393
See application file for complete search history.

(56) References Cited

U.S. PATENT DOCUMENTS

| 5,286,991 | A  | * | 2/1994 | Hui et al. ............. 257/306 |
| 6,964,875 | B1 | * | 11/2005 | En et al. ............. 438/14 |
| 6,965,253 | B1 |   | 11/2005 | Chen et al. |
| 7,411,270 | B2 |   | 8/2008 | Min et al. |

* cited by examiner

*Primary Examiner* — Eugene Lee
*Assistant Examiner* — Elias M Ullah
(74) *Attorney, Agent, or Firm* — James L. Clingan, Jr.; Joanna G. Chiu

(57) ABSTRACT

A semiconductor device includes an isolated p-type well, wherein the isolated p-type well is a first electrode of a capacitor device; a capacitor dielectric on the isolated p-type well; a p-type polysilicon electrode over the capacitor dielectric, wherein the p-type polysilicon electrode is a second electrode of the capacitor device; a first p-type contact region in the isolated p-type well, laterally extending from a first sidewall of the p-type polysilicon electrode; a second p-type contact region in the isolated p-type well, laterally extending from a second sidewall of the p-type polysilicon electrode, opposite the first sidewall of the p-type polysilicon electrode, wherein a portion of the isolated p-type well between the first and second p-type contact regions is under the p-type polysilicon electrode and the capacitor dielectric; and an n-type isolation region surrounding the isolated p-type well. This device may be conveniently coupled to a fringe capacitor.

14 Claims, 4 Drawing Sheets

CAPACITOR DEVICE USING AN ISOLATED WELL AND METHOD THEREFOR

BACKGROUND

1. Field

This disclosure relates generally to capacitors, and more specifically, to capacitors using an isolated well.

2. Related Art

Capacitors are a commonly used element in circuits and in integrated circuits can require significant space and thus add cost. Also the amount of capacitance corresponds to the amount of space. Further, in many applications it is desirable to know what the capacitance actually is as accurately as possible. Another factor is the speed requirements of the circuit using the capacitor can also place demands on the performance of the capacitor. Also, low power applications will generally put a higher importance on leakage. With many devices being battery operated, this has become more important. Another significant issue is isolating the capacitor from other circuitry. The other circuitry may interfere with the capacitor operation and similarly the capacitor operation may interfere with the other circuitry. Thus, the issues of space, capacitance, speed, leakage, isolation, and precision are potentially significant for any given application. The significance of a given issue will vary with the application.

Accordingly, there is a need for a capacitor that provides the proper combination of features for a particular application while avoiding unduly increasing costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A capacitor device is made using mostly conventional process steps used in making a transistor. One electrode is a made using the same techniques used in making a gate electrode. It is separated from a semiconductor substrate of P-type by a thin dielectric that is made at the same time as gate dielectrics for transistors. The thin dielectric is over a P-type well, formed in the substrate, that forms the other electrode of the capacitor. The P-type well is isolated from the substrate by an isolation region of N type. The isolation region has a bottom portion under the well and side portions that extend from the bottom portion to a trench that is filled with insulating material. The well is thus isolated from the substrate by an isolation region that is the opposite conductivity type from the well and substrate. Further, the P well and a P-doped gate electrode provides for reduced leakage which can become significant when the thin dielectric is around or below 30 Angstroms. The gate being P type provides a higher tunnel barrier for electrons and thus reduces leakage. This is better understood by reference to the drawings and the following specification.

The semiconductor substrate described herein can be any semiconductor material or combinations of materials, such as gallium arsenide, silicon germanium, silicon, monocrystalline silicon, the like, and combinations of the above.

Figure 1:
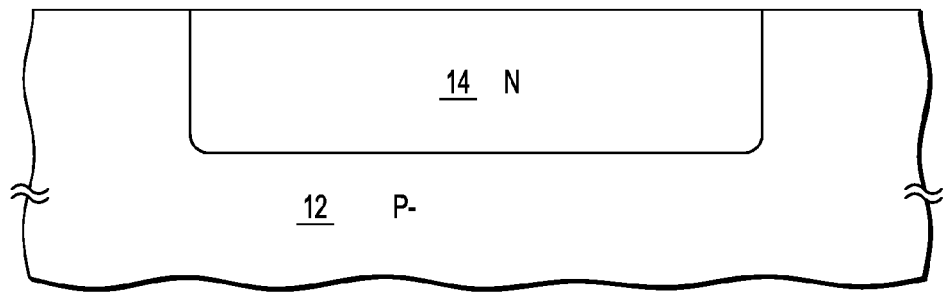
FIG. 1 is a cross section of a semiconductor device at a stage in processing.

Shown in FIG. 1 is a semiconductor device 10 comprising a substrate 12 having a buried layer 14 that has been selectively implanted to be N type. Substrate 12 is doped to be P type and may be designated as P—which references its relative doping concentration. Buried layer 14 is formed by implanting in the presence of a mask to limit the extent of buried layer 14. Silicon is currently preferred for the material of substrate 12. The thickness of buried layer 14 may be 1 to 2 microns thick after oxidation and thermal drive. The width is chosen to extend about 0.4 micron under a filled trench that will be formed in a subsequent stage in processing.

Figure 2:
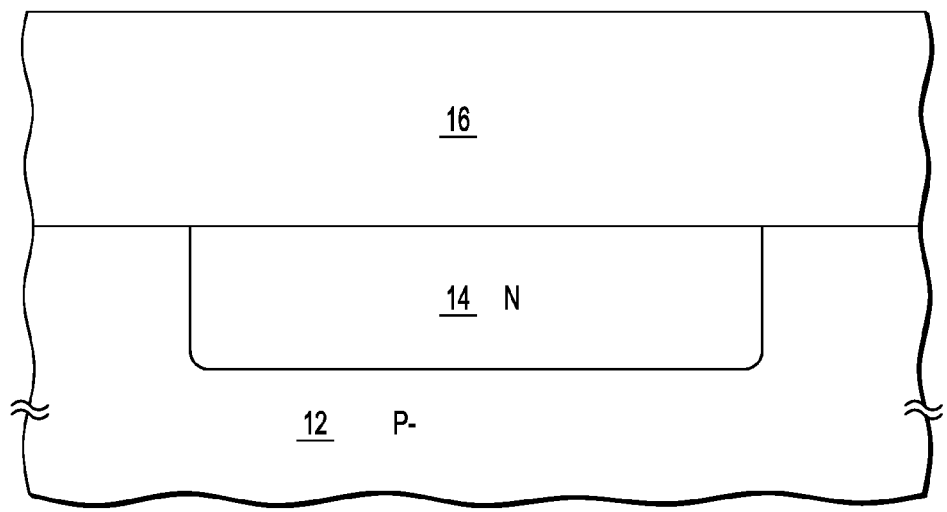
FIG. 2 is a cross section of the semiconductor device of FIG. 1 at a subsequent stage in processing.

Shown in FIG. 2 is semiconductor device 10 after growing an epitaxial layer 16 of silicon over substrate 12 including over buried layer 14. An epitaxial layer such as epitaxial layer 16 is commonly formed over a silicon substrate. Epitaxial layer 16 may be 2 to 3 microns thick.

Figure 3:
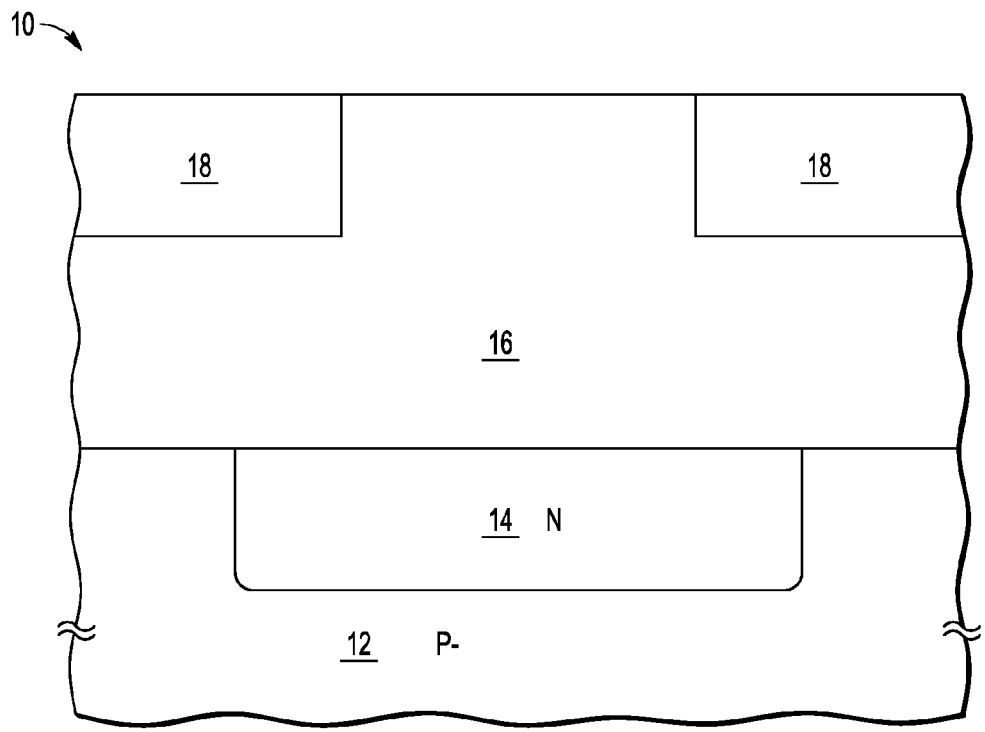
FIG. 3 is a cross section of the semiconductor device of FIG. 2 at a subsequent stage in processing.

Shown in FIG. 3 is semiconductor device 10 after forming a filled trench as an insulator region that surrounds a region where a transistor will be subsequently formed. The trench extends downward but not the full depth of the epitaxial layer 16. The downward extension may be 0.45 micron.

Figure 4:
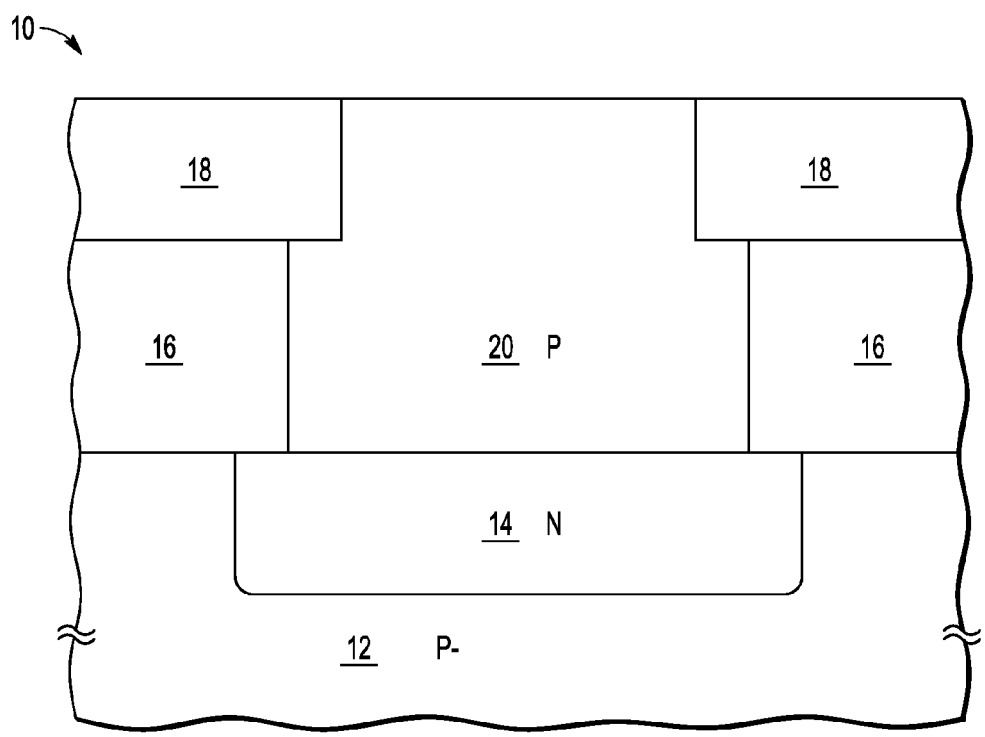
FIG. 4 is a cross section of the semiconductor device of FIG. 3 at a subsequent stage in processing.

Shown in FIG. 4 is semiconductor device 10 after selectively implanting epitaxial region 16 to form a well 20 of P-type that is over buried layer 14 but does not extend to the lateral edges of buried layer 14. Well is shown as P to indicate its relative doping level. Well 20 may be formed while other P-type wells for use in forming N type transistors. Well 20 may extend 0.6 micron under filled trench 18.

Figure 5:
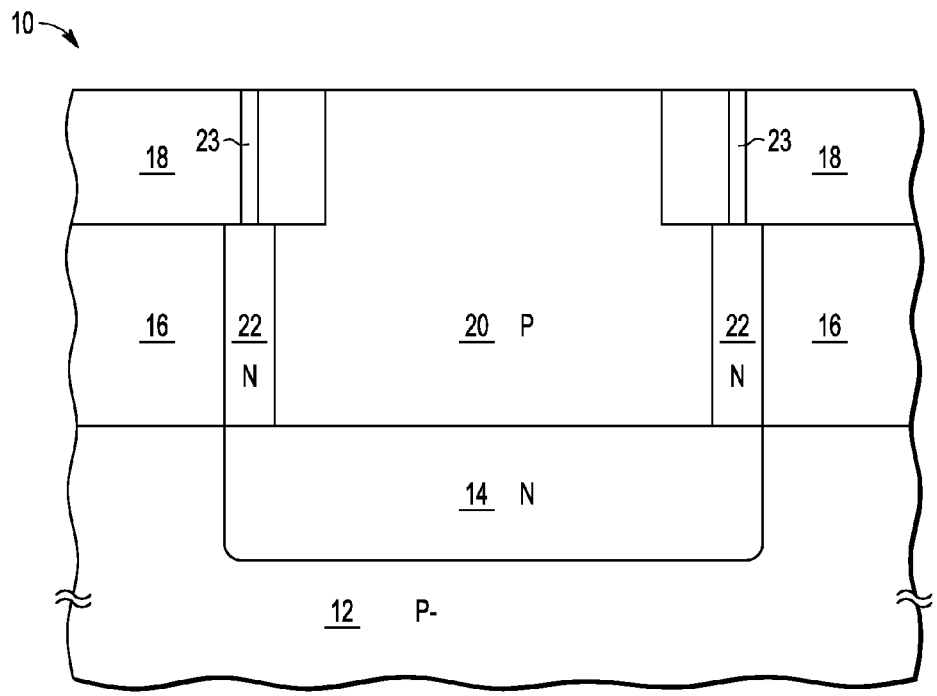
FIG. 5 is a cross section of the semiconductor device of FIG. 4 at a subsequent stage in processing.

Shown in FIG. 5 is semiconductor device 10 after selectively forming isolation region 22 surrounding well 20 and extending from the bottom of filled trench 18 to buried layer 14 and may have a width of 1 micron. Isolation region 22 is formed by a selective implant and is of N-type. Isolation region 22 is shown as N to indicate its relative doping level and may be formed at the same time as N-type wells for use in forming P type transistors. In addition an active open 23 is formed in filled trench 18 at a width that may be 0.3 micron. Active open 23 extends through filled trench 18 to isolation region 22. Active open 23 is formed by etching an opening in filled trench 18 aligned to isolation region 22 and filling the opening with polysilicon that may be in-situ doped. It may also be implanted or both. In either case active open 23 is N type and contacts isolation region 22. Active open 23 contacts a quiet node such as ground and thus biases isolation region 22 to the voltage of the quiet node. Active open 23 thus may be considered a terminal of device 10.

Figure 6:
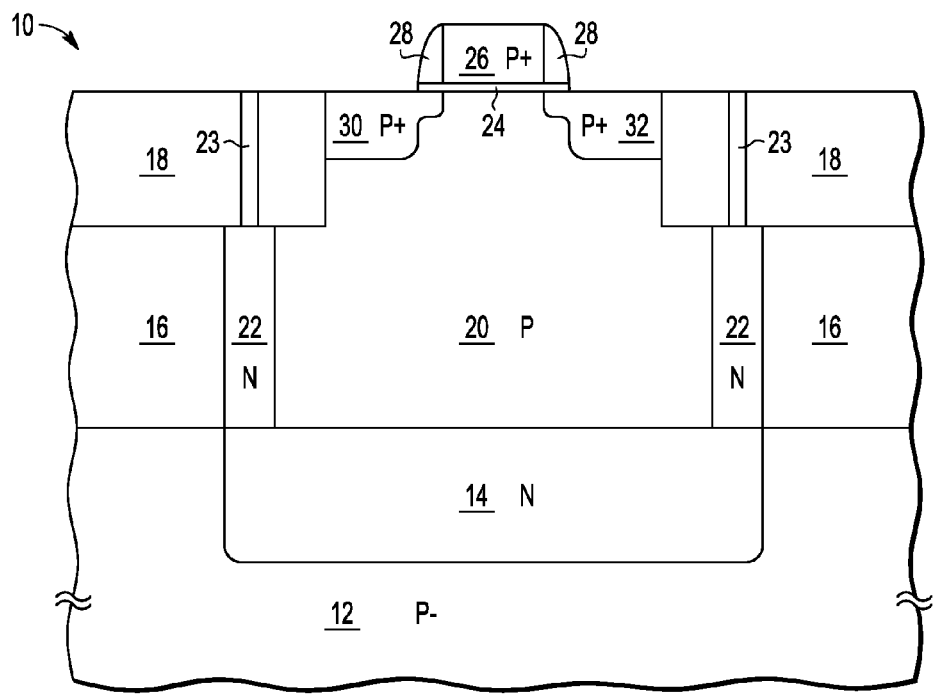
FIG. 6 is a cross section of the semiconductor device of FIG. 5 at a subsequent stage in processing.

Shown in FIG. 6 is semiconductor device 10 after forming an electrode 26 separated from well 20 by a dielectric 24. Dielectric 24 is currently preferred to be formed by growing oxide at a high temperature as is common for gate dielectrics. Electrode 26 and sidewall spacer 28 around gate 26 are used as masks for implants forming region 30 in well 20 on one side of electrode 26 and region 32 in well 20 on the opposite of electrode 26. These features 24, 26, 28, 30 and 32 are formed at the same time as gates and source/drains are formed in achieving P type transistors. The P type transistors are formed in N wells whereas as features 24, 26, 28, 30 and 32 are formed in a P well, well 20. The result is a capacitor in which well 20 is one electrode and electrode 26 is the other electrode. The dielectric of the capacitor is dielectric 24 and is preferably 30 Angstroms or less in thickness. Regions 30 and 32 are useful as contacts for contacting the well electrode of the capacitor. Electrode 26 is preferably polysilicon and is doped to P-type during the formation of regions 30 and 32. There is a relatively light P-type implant without sidewall spacer 28 present and a relatively heavy and deeper P-type implant while sidewall spacer 28 is present.

Figure 7:
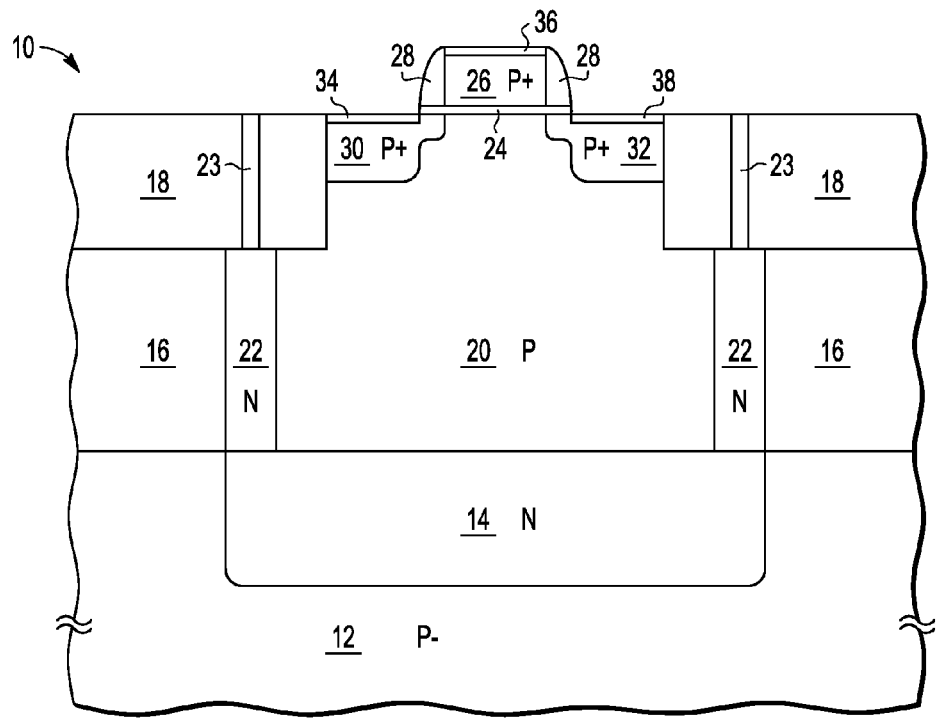
FIG. 7 is a cross section of the semiconductor device of FIG. 6 at a subsequent stage in processing.

Shown in FIG. 7 is device 10, which is now a capacitor, after forming a silicide region on 34 at the surface of region 30, a silicide region 36 at the surface of electrode 26, and a silicide region 38 at the surface of region 32.

Figure 8:
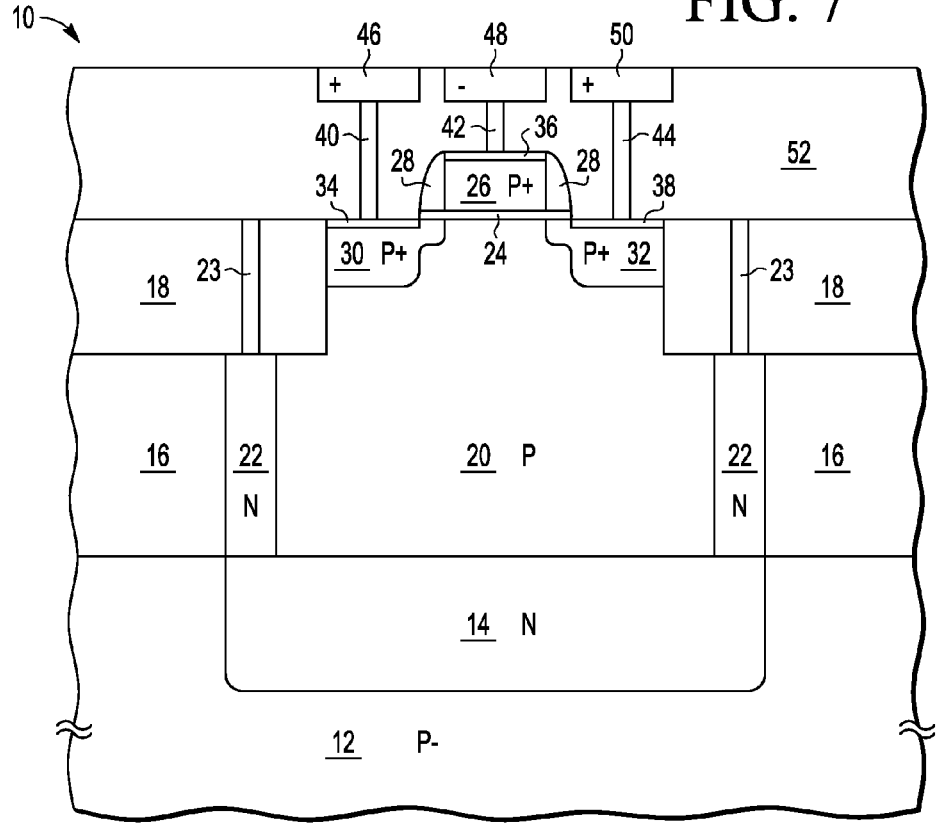
FIG. 8 is a cross section of the semiconductor device of FIG. 7 at a subsequent stage in processing.

Shown in FIG. 8 is device 10 after forming a fringe capacitor comprising a metal portion 46, a metal portion 48, and a metal portion 50. Metal portion 48 is designated with a minus sign "−" to indicate one electrode and metal portions 46 and 50 are designated with a plus sign "+" to indicate the other electrode. An interlayer dielectric (ILD) 52 is formed over silicide regions 34, 36, and 38; sidewall spacer 28, and filled trench 18. Metal portions 46, 48, and 50 are laterally adjacent at the top surface of ILD 52. Metal portion 48 is between metal portions 46 and 50. Metal portion 48 is connected to electrode 26 through a contact 42 and silicide portion 36. Metal portion 46 is connected to region 30 through a contact 40 and silicide 34. Metal portion 50 is connected to region 32 through a contact 44 and silicide 38. The fringe capacitor formed by metal portions 46, 48, and 50 uses the portion of ILD 52 between these metal portions as the capacitor dielectric. Metal portions 50 and 46 are also connected to each other in a location not shown in FIG. 8. Additional layer of fringe capacitance may also be added as additional layers of metal and ILD are provided. Further, many additional metal portions at the same metal layer as for metal portions 46, 48, and 50 could be added laterally. This shows that additional capacitance in the form a fringe capacitor may added to the capacitance of the capacitor formed form electrode 26 and well 20.

In operation, device 10 of FIGS. 6, 7, and 8 functions as a capacitor that has excellent isolation from substrate 12 and has low leakage and high capacitance density. The bottom of well 20 is isolated from substrate 12 by buried layer 14 which is a different conductivity type from both substrate 12 and well 14. This difference in conductivity enhances the isolation. This same type of isolation is present on the lower side of well 20 where region 22, which is again a different conductivity from both well 20 and substrate 12, is between well 20 and substrate 12. The higher side of well 20 is adjacent to filled trench 18. Filled trench is preferably deposited oxide which is very thick and provides very minimal coupling to or from well 20. Above well 20 are electrode contacts and ILD 52. The coupling at this location is primarily desirable, either an electrode contact or the desired capacitance with electrode 26. Further, well 20 provides for lower leakage due to being P type. Tunneling leakage current carriers through dielectric 24 in the accumulation mode, which is the high capacitance mode for operation, are holes unlike electrons for the case of an N-type well. Thus, for the same thickness, the leakage through dielectric 24 is much lower due to the higher tunneling barrier for holes and for the higher hole effective mass. This difference has been discovered to become important with a low dielectric thickness, thicknesses that are not above 30 Angstroms, of the capacitor dielectric which is dielectric 24. Accordingly, there is a benefit in having an isolation region around the well that is of a different conductivity type from both the substrate and the well and of the well being P-type which has the effect of making the isolation N-type and the substrate P-type.

By now it should be appreciated that there has been provided a semiconductor device including an isolated p-type well, wherein the isolated p-type well is a first electrode of a capacitor device. The semiconductor device further includes a capacitor dielectric over the isolated p-type well. The semiconductor device further includes a p-type polysilicon electrode over the capacitor dielectric, wherein the p-type polysilicon electrode is a second electrode of the capacitor device. The semiconductor device further includes a first p-type contact region in the isolated p-type well, laterally extending from a first sidewall of the p-type polysilicon electrode. The semiconductor device further includes a second p-type contact region in the isolated p-type well, laterally extending from a second sidewall of the p-type polysilicon electrode, opposite the first sidewall of the p-type polysilicon electrode, wherein a portion of the isolated p-type well between the first p-type contact region and the second p-type contact region is under the p-type polysilicon electrode and the capacitor dielectric. The semiconductor device further includes an n-type isolation region surrounding the isolated p-type well. The semiconductor device may further comprise a p-type semiconductor substrate, wherein the isolated p-type well is over the semiconductor substrate, and a horizontal portion of the n-type isolation region is between the isolated p-type well and the p-type semiconductor substrate. The semiconductor device may further comprise a semiconductor layer over the p-type substrate layer, wherein the isolated p-type well is in the semiconductor layer, and wherein a vertical portion of the n-type isolation region is between the isolated p-type well and the semiconductor layer. The semiconductor device may further comprise a trench isolation region in the semiconductor layer, wherein the trench isolation region is over and in contact with the vertical portion of the n-type isolation region, and wherein the first p-type contact region extends laterally from the first sidewall of the p-type polysilicon electrode to the trench isolation region and the second p-type contact region extends laterally from the second sidewall of the p-type polysilicon electrode to the trench isolation region. The semiconductor device may have a further characterization by which the trench isolation region and the n-type isolation region, in combination, fully isolates the isolated p-type well from the semiconductor layer and the p-type semiconductor substrate. The semiconductor device may have a further characterization by which each of the first p-type contact region, the second p-type contact region, and the p-type polysilicon electrode is more heavily doped as compared to the isolated p-type well. The semiconductor device may have a further characterization by which a thickness of the capacitor dielectric is not greater than 30 Angstroms. The semiconductor device may further comprise a fringe capacitor over the p-type polysilicon electrode, wherein a first electrode of the fringe capacitor is electrically coupled to each of the first p-type contact region and the second p-type contact region, and a second electrode of the fringe capacitor is electrically coupled to the p-type polysilicon electrode. The semiconductor device may further comprise a fringe capacitor over the p-type polysilicon electrode and the isolated P well and electrically coupled in parallel with the capacitor device. The semiconductor device may further comprise a sidewall spacer adjacent the first and second sidewalls of the p-type polysilicon electrode and over a portion of the first p-type contact region and over a portion of the second p-type contact region.

Also described is a semiconductor device including a p-type semiconductor substrate. The semiconductor device further includes a buried n-type layer over the p-type semiconductor substrate. The semiconductor device further includes a semiconductor layer formed over the p-type semiconductor substrate. The semiconductor device further includes an isolated p-type well in the semiconductor layer, wherein the isolated p-type well is over and in contact with the buried n-type layer and is a first electrode of a capacitor device. The semiconductor device further includes a capacitor dielectric over the isolated p-type well. The semiconductor device further includes a p-type polysilicon electrode over the capacitor dielectric, wherein the p-type polysilicon electrode is a second electrode of the capacitor device. The semiconductor device further includes a first p-type contact region in the isolated p-type well, laterally extending from a first sidewall of the p-type polysilicon electrode. The semiconductor device further includes a second p-type contact region in the isolated p-type well, laterally extending from a second sidewall of the p-type polysilicon electrode, opposite the first sidewall of the p-type polysilicon electrode, wherein a portion of the isolated p-type well between the first p-type contact region and the second p-type contact region is under and in contact with the capacitor dielectric. The semiconductor device further includes a vertical n-type isolation region in the semiconductor layer, wherein the vertical n-type isolation region is over and in contact with the buried n-type layer and surrounds the isolated p-type well. The semiconductor device may further include a trench isolation region in the semiconductor layer, wherein the trench isolation region is over and in contact with the vertical portion of the n-type isolation region, and wherein the first p-type contact region extends laterally from the first sidewall of the p-type polysilicon electrode to the trench isolation region and the second p-type contact region extends laterally from the second sidewall of the p-type polysilicon electrode to the trench isolation region. The semiconductor device may have a further characterization by which the trench isolation region and the n-type isolation region, in combination, fully isolates the isolated p-type well from the semiconductor layer and the p-type semiconductor substrate. The semiconductor device may further include a sidewall spacer adjacent the first and second sidewalls of the p-type polysilicon electrode, wherein the sidewall spacer is over a portion of the first p-type contact region and over a portion of the second p-type contact region. The semiconductor device may have a further characterization by which each of the first p-type contact region, the second p-type contact region, and the p-type polysilicon electrode is more heavily doped as compared to the isolated p-type well. The semiconductor device may have a further characterization by which a thickness of the capacitor dielectric is not greater than 30 Angstroms. The semiconductor device may further include a fringe capacitor over the p-type polysilicon electrode, wherein a first electrode of the fringe capacitor is electrically coupled to each of the first p-type contact region and the second p-type contact region, and a second electrode of the fringe capacitor is electrically coupled to the p-type polysilicon electrode.

Described also is a method for forming a semiconductor device that includes forming a buried n-type layer in a p-type semiconductor substrate. The method further includes forming a semiconductor layer over the p-type semiconductor substrate. The method further includes forming a trench isolation region in the semiconductor layer. The method further includes forming a p-type well in the semiconductor layer, wherein the p-type well is over and in contact with the buried n-type layer, and wherein the p-type well is a first electrode of a capacitor device. The method further includes forming a vertical n-type isolation region in the semiconductor layer, wherein the vertical n-type isolation region is under and in contact with the trench isolation region, over and in contact with the buried n-type layer, and surrounds the p-type well. The method further includes forming a dielectric layer over the isolated p-type well. The method further includes forming a p-type polysilicon electrode over the dielectric layer, wherein the p-type polysilicon electrode is a second electrode of the capacitor device. The method further includes forming a first p-type contact region and a second p-type contact region in the p-type well using the p-type polysilicon electrode as a mask, wherein the first p-type contact region laterally extends from a first sidewall of the p-type polysilicon electrode to the trench isolation region, and the second p-type contact region laterally extends from a second sidewall of the p-type polysilicon electrode, opposite the first sidewall of the p-type polysilicon electrode, to the trench isolation region. The method may further include after the step of forming the p-type polysilicon electrode, forming a sidewall spacer adjacent a sidewall of the p-type polysilicon electrode. The method may have a further characterization by which the step of forming the dielectric layer is further characterized in that the dielectric layer has a thickness of not greater than 30 Angstroms.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, many dimensions concerning thicknesses have been presented as dimensions that may be used. Those dimensions may be altered as desired for a particular process or lithographic capability or other reason. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
an isolated p-type well, wherein the isolated p-type well is a first electrode of a capacitor device;
a capacitor dielectric over the isolated p-type well;
a p-type polysilicon electrode over the capacitor dielectric, wherein the p-type polysilicon electrode is a second electrode of the capacitor device;
a first p-type contact region in the isolated p-type well, laterally extending from a first sidewall of the p-type polysilicon electrode, and functions as a contact while being p-type;
a second p-type contact region in the isolated p-type well, laterally extending from a second sidewall of the p-type polysilicon electrode, opposite the first sidewall of the p-type polysilicon electrode, and functions as a contact while being p-type, wherein a portion of the isolated p-type well between the first p-type contact region and the second p-type contact region is under the p-type polysilicon electrode and the capacitor dielectric;
an n-type isolation region surrounding the isolated p-type well on sides and a bottom of the isolated p-type well;
a p-type semiconductor substrate, wherein the isolated p-type well is over the semiconductor substrate, and a horizontal portion of the n-type isolation region between the isolated p-type well and the p-type semiconductor substrate to isolate the isolated P-type well from the P-type semiconductor substrate;
a semiconductor layer over the p-type substrate layer, wherein the isolated p-type well is in the semiconductor layer, and wherein a vertical portion of the n-type isolation region is between the isolated p-type well and the semiconductor layer; and
a trench isolation region in the semiconductor layer comprised of an insulating material having an opening therethrough filled with conductive material, wherein the trench isolation region is over and in physical contact with the vertical portion of the n-type isolation region and the conductive material is in physical and electrical contact with a portion of the vertical portion of the n-type isolation region, and wherein the first p-type contact region extends laterally from the first sidewall of the p-type polysilicon electrode to the trench isolation region and the second p-type contact region extends laterally from the second sidewall of the p-type polysilicon electrode to the trench isolation region.

2. The semiconductor device of claim 1, wherein the trench isolation region and the n-type isolation region, in combination, fully isolates the isolated p-type well from the semiconductor layer and the p-type semiconductor substrate.

3. The semiconductor device of claim 1, wherein each of the first p-type contact region, the second p-type contact region, and the p-type polysilicon electrode is more heavily doped as compared to the isolated p-type well.

4. The semiconductor device of claim 1, wherein a thickness of the capacitor dielectric is not greater than 30 Angstroms.

5. The semiconductor device of claim 1, further comprising:
a fringe capacitor over the p-type polysilicon electrode, wherein a first electrode of the fringe capacitor is electrically coupled to each of the first p-type contact region and the second p-type contact region, and a second electrode of the fringe capacitor is electrically coupled to the p-type polysilicon electrode.

6. The semiconductor device of claim 1, further comprising:
a fringe capacitor over the p-type polysilicon electrode and the isolated P well and electrically coupled in parallel with the capacitor device.

7. The semiconductor device of claim 1, further comprising:
a sidewall spacer adjacent the first and second sidewalls of the p-type polysilicon electrode and over a portion of the first p-type contact region and over a portion of the second p-type contact region.

8. A semiconductor device comprising
a p-type semiconductor substrate;
a buried n-type layer over the p-type semiconductor substrate;
a semiconductor layer formed over the p-type semiconductor substrate;
an isolated p-type well in the semiconductor layer, wherein the isolated p-type well is over and in contact with the buried n-type layer and is a first electrode of a capacitor device, wherein the n-type layer functions to isolate the isolated p-type well from the p-type semiconductor substrate on a bottom side of the isolated p-type well;
a capacitor dielectric over the isolated p-type well;
a p-type polysilicon electrode over the capacitor dielectric, wherein the p-type polysilicon electrode is a second electrode of the capacitor device;
a first p-type contact region in the isolated p-type well, laterally extending from a first sidewall of the p-type polysilicon electrode, and functions as a contact while being p-type;
a second p-type contact region in the isolated p-type well, laterally extending from a second sidewall of the p-type polysilicon electrode, opposite the first sidewall of the p-type polysilicon electrode, and functions as a contact while being p-type, wherein a portion of the isolated p-type well between the first p-type contact region and the second p-type contact region is under and in contact with the capacitor dielectric;
a vertical n-type isolation region in the semiconductor layer, wherein the vertical n-type isolation region is over and in contact with the buried n-type layer and surrounds the isolated p-type well; and
a trench isolation region in the semiconductor layer comprised of an insulating material having an opening therethrough filled with conductive material, wherein the trench isolation region is over and in physical contact with the vertical n-type isolation region and the conductive material is in physical and electrical contact with a portion of the vertical portion n-type isolation region.

9. The semiconductor device of claim 8, wherein:
p-type polysilicon electrode to the trench isolation region and the second p-type contact region extends laterally from the second sidewall of the p-type polysilicon electrode to the trench isolation region.

10. The semiconductor device of claim 9, wherein the trench isolation region and the n-type isolation region, in combination, isolate sides of the isolated p-type well from the semiconductor layer.

11. The semiconductor device of claim 9, further comprising:
a sidewall spacer adjacent the first and second sidewalls of the p-type polysilicon electrode, wherein the sidewall spacer is over a portion of the first p-type contact region and over a portion of the second p-type contact region.

12. The semiconductor device of claim 11, wherein each of the first p-type contact region, the second p-type contact region, and the p-type polysilicon electrode is more heavily doped as compared to the isolated p-type well.

13. The semiconductor device of claim 11, wherein a thickness of the capacitor dielectric is not greater than 30 Angstroms.

14. The semiconductor device of claim 8, further comprising:
   a fringe capacitor over the p-type polysilicon electrode, wherein a first electrode of the fringe capacitor is electrically coupled to each of the first p-type contact region and the second p-type contact region, and a second electrode of the fringe capacitor is electrically coupled to the p-type polysilicon electrode.

* * * * *